United States Patent [19]
Schwartz et al.

[11] Patent Number: 5,930,682
[45] Date of Patent: Jul. 27, 1999

[54] CENTRALIZED CHANNEL SELECTION IN A DISTRIBUTED RF ANTENNA SYSTEM

[75] Inventors: Adam L. Schwartz; Simon P. Yeung; John B. Georges, all of Berkeley; David M. Cutrer, Walnut Creek, all of Calif.

[73] Assignee: LGC Wireless, Inc., Berkeley, Calif.

[21] Appl. No.: 08/864,298

[22] Filed: May 28, 1997

Related U.S. Application Data

[63] Continuation-in-part of application No. 08/635,368, Apr. 19, 1996, abandoned.

[51] Int. Cl.⁶ .................................................. H04B 3/36
[52] U.S. Cl. .......................... 455/14; 455/22; 455/209; 455/318
[58] Field of Search ............................. 455/14, 20, 22, 455/63, 66, 208, 209, 316, 317, 318, 319, 11.1, 12.1

[56] References Cited

U.S. PATENT DOCUMENTS

| | | | |
|---|---|---|---|
| 3,922,674 | 11/1975 | Gingras, Jr. et al. | 455/22 |
| 4,476,574 | 10/1984 | Struven | 455/14 |
| 4,776,039 | 10/1988 | Akaiwa | 455/209 |
| 5,404,570 | 4/1995 | Charas et al. | 455/22 |
| 5,428,836 | 6/1995 | Sanecki et al. | 455/209 |
| 5,603,080 | 2/1997 | Kallander et al. | 455/14 |

FOREIGN PATENT DOCUMENTS 9413067  6/1994  WIPO ........................... H04B 5/00

*Primary Examiner*—Reinhard J. Eisenzopf
*Assistant Examiner*—Sam Bhattacharya
*Attorney, Agent, or Firm*—Lumen Intellectual Property Services

[57] ABSTRACT

Individual channels are centrally and tunably selected for emission in a distributed wireless communications system. A high-frequency signal received at a central antenna is down-converted such that a selected channel corresponds to a predetermined frequency range. Non-selected channels are filtered out. The selected channel is transmitted to remote locations over commonly available transmission lines, up-converted, and re-emitted. The transmitted channel is chosen by tuning the frequency of the local oscillator used for down-conversion. A high-stability global tuning signal is used to tune and stabilize the local oscillators used for up-conversion. The global tuning signal is generated by frequency-dividing the down-conversion local oscillator signal by a fixed number, while the up-conversion local oscillator signals are generated by frequency-multiplying the global tuning signal by the same fixed number. Phase-locked loops are used for frequency multiplication and stabilization. Applications include cellular communications, cordless telephony, local RF communications, interactive multimedia video, and high bit-rate local communications.

27 Claims, 4 Drawing Sheets

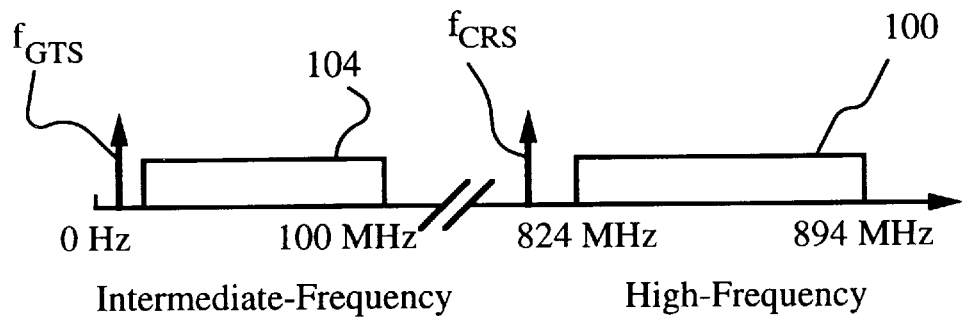
FIG. 3-A
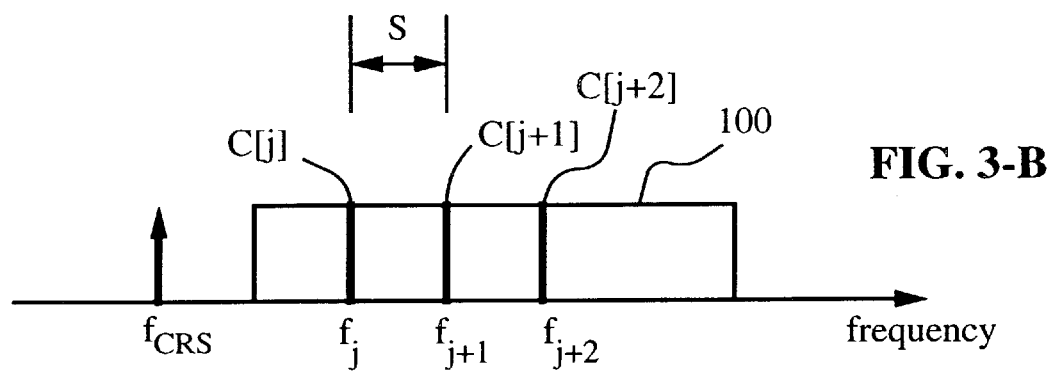
FIG. 3-B
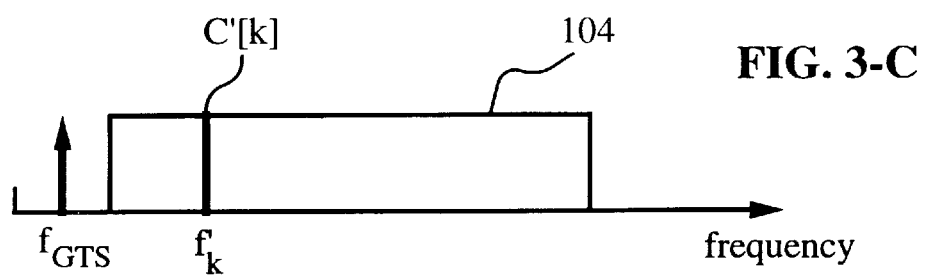
FIG. 3-C

CENTRALIZED CHANNEL SELECTION IN A DISTRIBUTED RF ANTENNA SYSTEM

RELATED APPLICATION DATA

This application is a continuation in part of U.S. patent application Ser. No. 08/635,368, filed Apr. 19, 1996, entitled "Distribution of Radio-Frequency Signals Through Low Bandwidth Infrastructures," which is herein incorporated by reference now abandoned.

FIELD OF THE INVENTION

This invention relates to the field of wireless communications, and in particular to a radio-frequency distribution system with centralized tunable channel selection.

BACKGROUND OF THE INVENTION

Distribution of RF signals is particularly difficult inside buildings and in complex areas, where obstacles scatter or absorb RF radiation. In-building distribution systems consist of two major parts: a set of repeater antennas and accessories required for re-transmitting RF signals inside buildings, and a cabling system such as an optical fiber network for interconnecting the in-building antennas with a main antenna. The main antenna is usually installed on top of the building, while the repeaters are located within various rooms inside the building.

The cost of installing in-building distribution networks is generally very high, and includes the cost of multiple repeater antennas, associated electronics, and links, as well as the cost of installing the antennas and suitable links. It is desirable that the signal processing electronics used at the repeater sites be simple, robust, and inexpensive. It is also desirable that the signals distributed through the network be compatible with pre-existing in-building wiring infrastructure, since installing specialized links can be prohibitively expensive.

The above-referenced parent U.S. patent application Ser. No. 08/635,368 describes a system for distributing high-frequency signals using repeaters connected to a central station by low-bandwidth transmission lines. The transmission lines are unsuitable for transmitting the high-frequency signals. The signals are down-converted, transmitted to the repeaters over the transmission lines, up-converted, and emitted. Low-stability, inexpensive oscillators used for down- and up-conversion are frequency-stabilized using a single, central high-stability oscillator.

In U.S. Pat. No. 5,603,080, herein incorporated by reference, Kallander et al. describe a repeater system for use in complex environments. The system comprises two-way frequency converters for down-converting a centrally received high-frequency signal, and recovering the signal at remote locations by up-conversion. The system described by Kallander et al. re-transmits the entire frequency band of the received signal.

OBJECTS AND ADVANTAGES OF THE INVENTION

In light of the above, it is a primary object of the present invention to provide a signal distribution system allowing tunable, centralized channel selection for multiple repeaters. It is another object to provide a system allowing increased emission powers for repeater antennas and simplified signal processing by restricting the bandwidth transmitted through the system. Another object is to provide a system that is capable of making use of pre-existing low-bandwidth wiring infrastructure. Another object is to provide a system wherein signal reconstruction at the repeater locations involves only fixed operations performed on centrally-generated tunable signals; such fixed operations can be performed by simple, low-cost elements. Yet another object of the invention is to provide an in-building high-frequency distribution system using low-stability, low-cost remote oscillators that are frequency-stabilized using a single central high-stability oscillator. These and other objects and advantages will become more apparent after consideration of the ensuing description and the accompanying drawings.

SUMMARY OF THE INVENTION

In the following discussion, for some quantity A and some index j, the notation $\{A[j]\}$ is understood to refer to a set of $A[j]$ for j between 1 and a maximum value J. The index j is generally used to refer to all channels received by a system of the present invention, while the index k is generally used to refer to channels selected for emission by a system of the present invention. The statement that a quantity if fixed is understood to mean that the quantity is independent of which channel(s) is/are selected for emission by a system of the present invention.

The present invention provides a distributed wireless communications system with centralized tunable channel selection. The system comprises a central receiving means for receiving a central high-frequency signal comprising a plurality of channels $\{C[j]\}$, j=1 ... J, a central tunable channel selection means for selecting a channel $C[k]$ for emission, and plural remote emission means for selectively emitting the channel $C[k]$.

The central receiving means preferably comprises a receiver antenna for wireless communications. The central high-frequency signal is preferably within a frequency band used for cellular communications, cordless telephony, personal communication services, local radio-frequency communications, satellite television, interactive multi-media video, or high bit-rate local area networks.

The central channel selection means comprises a central mixing means in communication with the central receiving means, and a central reference means in communication with the central mixing means. The central mixing means generates an intermediate signal from the central high-frequency signal and a central reference signal. The intermediate signal comprises a channel $C'[k]$ corresponding to the channel $C[k]$. The channel $C'[k]$ encodes the information contained in channel $C[k]$, but is centered at a different (preferably lower) frequency than channel $C[k]$. The central reference means generates the central reference signal, and controls the frequency of the central reference signal such that the channel $C'[k]$ is suitable for transmission through a filtering means of a fixed bandwidth. Channels other than $C'[k]$ are filtered out by the filtering means. A digitization means in communication with the filtering means digitizes the intermediate signal after passage through the filtering means. Channel $C[k]$ preferably comprises a plurality of code-division-multiple-access (CDMA) carriers, such that channel $C[k]$ is capable of supporting multiple users.

Limiting the bandwidth of the signal selected for emission is advantageous because it allows an increase in the power of the emitted signal. Such an increase in power for a signal of a broad bandwidth would lead to distortions at signal processing elements such as amplifiers and mixers. Furthermore, limiting the transmitted intermediate signal to a single channel greatly facilitates its digitization if analog to digital conversion is to be performed.

A plurality of remote mixing means are each in communication with the central mixing means over the filtering means, and generate a corresponding plurality of identical remote high-frequency signals. Each remote mixing means generates a remote high-frequency signal from the intermediate signal and a remote reference signal. The remote high-frequency signal comprises the channel C[k], and does not include at least some of the channels {C[j]}. Preferably, the remote high-frequency signal consists essentially of the channel C[k]. Each of the plural remote mixing means is in communication with a corresponding remote emission means, which emits the remote high-frequency signal. The remote emission means are preferably repeater antennas for wireless communications.

The central channel selection means further comprises a global tuning means for generating a global tuning signal. The global tuning signal controls the frequency of the remote reference signal, thus controlling the frequency of the remote high-frequency signal. A remote reference means in communication with the global tuning means generates the remote reference signal, and controls the frequency of the remote reference signal using the global tuning signal. Preferably, the remote reference means generates the remote reference signal by performing a fixed operation on the global tuning signal. The frequency of the global tuning signal is indicative of the frequency of the central reference signal, and implicitly of the identity of the channel C[k] selected for emission. The fixed operation can then be a fixed frequency-multiplication operation. Generating the remote reference signal by performing a fixed operation on the centrally-generated global tuning signal allows a relatively simple design for the remote subsystem.

The remote frequency means frequency-stabilizes the remote reference signal using the global tuning signal. Preferably, the remote reference means comprises a phase-locked loop (PLL) for phase-locking the remote reference signal to the global tuning signal. The PLL also acts as a frequency multiplication means for generating the remote reference signal by frequency-multiplying the global tuning signal. The frequency multiplication means is preferably adapted to multiply the global tuning signal by a fixed number. The global tuning signal is preferably generated by frequency-dividing the central reference signal using a frequency division means. The numbers characterizing the frequency-multiplication means and the frequency division means are preferably identical, such that the remote reference signal is identical in frequency to the central reference signal.

More generally, the global tuning signal is preferably derived from the central reference signal and has a stable frequency relationship with the central reference signal. Ensuring that the remote reference signal has a stable frequency relationship with the central reference signal is then achieved by establishing a stable frequency relationship between the remote reference signal and the global tuning signal. For further information on the importance of frequency-matching the central and remote reference signals see the above-incorporated U.S. patent application Ser. No. 08/635,368.

The central channel selection means comprises a high-stability oscillator such as a temperature-stabilized crystal oscillator, for generating a central high-stability signal. The global tuning signal and the central reference signal have stable frequency relationships with the central high-stability signal. The use of a central high-stability signal allows the use of relatively inexpensive low-stability oscillators for generating the central and remote reference signals. The central and remote reference signals are frequency-matched within an interchannel spacing of channels {C[j]}.

The central reference means preferably generates the central reference signal by frequency-multiplying the high-stability signal by an integer ratio N/M, wherein M is fixed and N is tunable, and N and M are chosen such that an integer change in N leads to a change in the central reference signal frequency equal to an integer multiple of the interchannel spacing of {C[j]}. The number M is preferably equal to the ratio of the frequency of the high-stability signal to the interchannel spacing, while the number N determines the identity of the channel C[k] selected for emission.

In one embodiment, the transmission means providing communication between the central and remote mixing means is a low-bandwidth line unsuitable for transmitting the central high-frequency signal, and in particular the channel C[k]. The transmission means is suitable for transmitting the intermediate signal, including the channel C'[k]. A low-bandwidth transmission line can be a line that is pre-installed in a building, such as 10 base T cable, telephone wire, fiber-optic cable, unshielded cable or power cable. Power cables are advantageous since they can be used to provide power to the remote subsystems. The intermediate signal is chosen to correspond to the frequency difference between the central high-frequency signal and the central reference signal. In such an embodiment, the down-conversion performed by the central mixing means has the added advantage that it allows transmitting the information of the central high-frequency signal to the remote emission means, without requiring the costly installation of new transmission infrastructure capable of supporting the central high-frequency signal. For further information on distribution of information contained in high-frequency signals through low-bandwidth transmission lines see the above-incorporated U.S. patent application Ser. No. 08/635,368.

DESCRIPTION OF THE FIGURES

FIG. 3-A is a diagram showing typical high-frequency and intermediate-frequency bands according to the present invention.

FIG. 3-B shows the high-frequency band of FIG. 3-A.

FIG. 3-C shows the intermediate-frequency band of FIG. 3-A.

DETAILED DESCRIPTION

Figure 1:
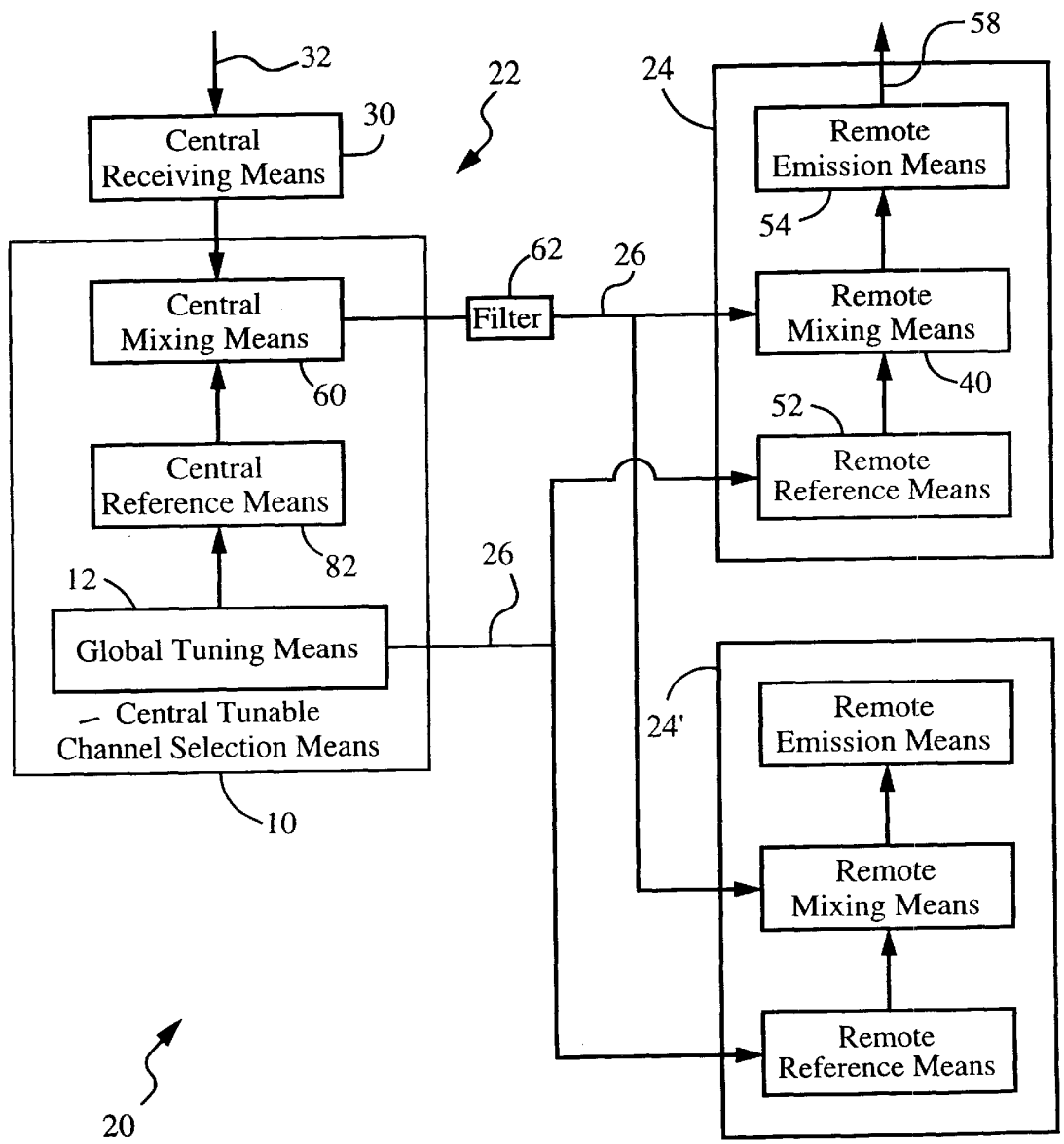
FIG. 1 is a high-level schematic diagram of a signal distribution system of the present invention.

FIG. 1 is a high-level schematic diagram of a system 20 of the present invention. System 20 is particularly suited for wireless communications distribution in buildings or complex areas. System 20 is bidirectional; however, for clarity of presentation only one communication direction (downlink) is illustrated in the discussion below. System 20 comprises a central subsystem 22 in communication with a plurality of remote subsystems 24, 24' over an intermediate-frequency (IF) transmission means 26. For simplicity, only remote subsystem 24 will be discussed below. Subsystem 24' is identical in structure and operation to subsystem 24.

Central subsystem 22 comprises a central receiving means 30 for receiving a central high-frequency signal 32. Signal 32 includes a plurality of channels {C[j]}, j=1 ... J, J>1 (i.e.

channels C[1], C[2], ..., C[J]). Receiving means 30 preferably comprises a central radio-frequency antenna for wireless communications, typically situated on a rooftop. Alternatively, receiving means 30 comprises an interface to a cable or fiberoptic high-frequency distribution network, typically situated in a building basement.

Central subsystem 22 further comprises a central tunable channel selection means 10 in communication with receiving means 30. At any given time, channel selection means 10 tunably selects at least one channel C[k] for emission by remote subsystem 24. The index k can take in general any value between 1 and J. The value of the index k can be tuned during the operation of system 20.

Channel selection means 10 comprises a central mixing means (mixer) 60. Mixer 60 may be any suitable single-ended, balanced, double balanced, double-double balanced, or other mixer. An input of mixer 60 is connected to receiving means 30 over a link capable of accurately transmitting signal 32. Another input of mixer 60 is connected to an output of a central reference means 82. Central reference means 82 generates a central reference signal, preferably consisting of a single sinusoid. An input of central reference means 82 is in communication with an output of a global tuning means 12. An output of mixer 60 is connected to a selection filter 62 and to transmission means 26.

Mixer 60 generates an intermediate signal by mixing the central reference signal and the central high-frequency signal. The intermediate signal comprises two frequency bands, corresponding to the sum and difference, respectively, of the central high-frequency signal and central reference signal frequencies. The intermediate signal comprises a channel C'[k] corresponding to the channel C[k]. Global tuning means 12 controls the frequency of the central reference signal, such that channel C'[k] is suitable for transmission through filter 62. Filter 62 allows channel C'[k] for passage through transmission means 26, and filters out other channels {C[j]}, j k.

In many applications, transmission means 26 is not suitable for transmitting high-frequency signals, but is suitable for transmitting intermediate-frequency signals. The channel C'[k] then corresponds to the frequency difference between the central high-frequency signal and the central reference signal, such that C'[k] is centered at a lower frequency than C[k].

Remote subsystem 24 comprises a remote mixer 40, a remote reference means 52, and a remote emission means 54. Remote emission means 54 preferably comprises a repeater antenna for wireless communications, typically situated within a building or other complex area where coverage is desired. One input of mixer 40 is in communication with the output of mixer 60 over transmission means 26. and filter 62, while another input of mixer 40 is connected to an output of remote reference means 52. Remote reference means 52 generates a remote reference signal, preferably consisting of a single sinusoid. An input of remote reference means 52 is connected to an output of global tuning means 12. An output of mixer 40 is connected to an input of emission means 54.

Mixer 40 generates a remote high-frequency signal by mixing the intermediate signal and the remote reference signal. The high-frequency signal consists essentially of the channel C[k]. Global tuning means 12 controls the frequency of the remote reference signal, preferably such that it is equal to the frequency of the central reference signal.

Figure 2:
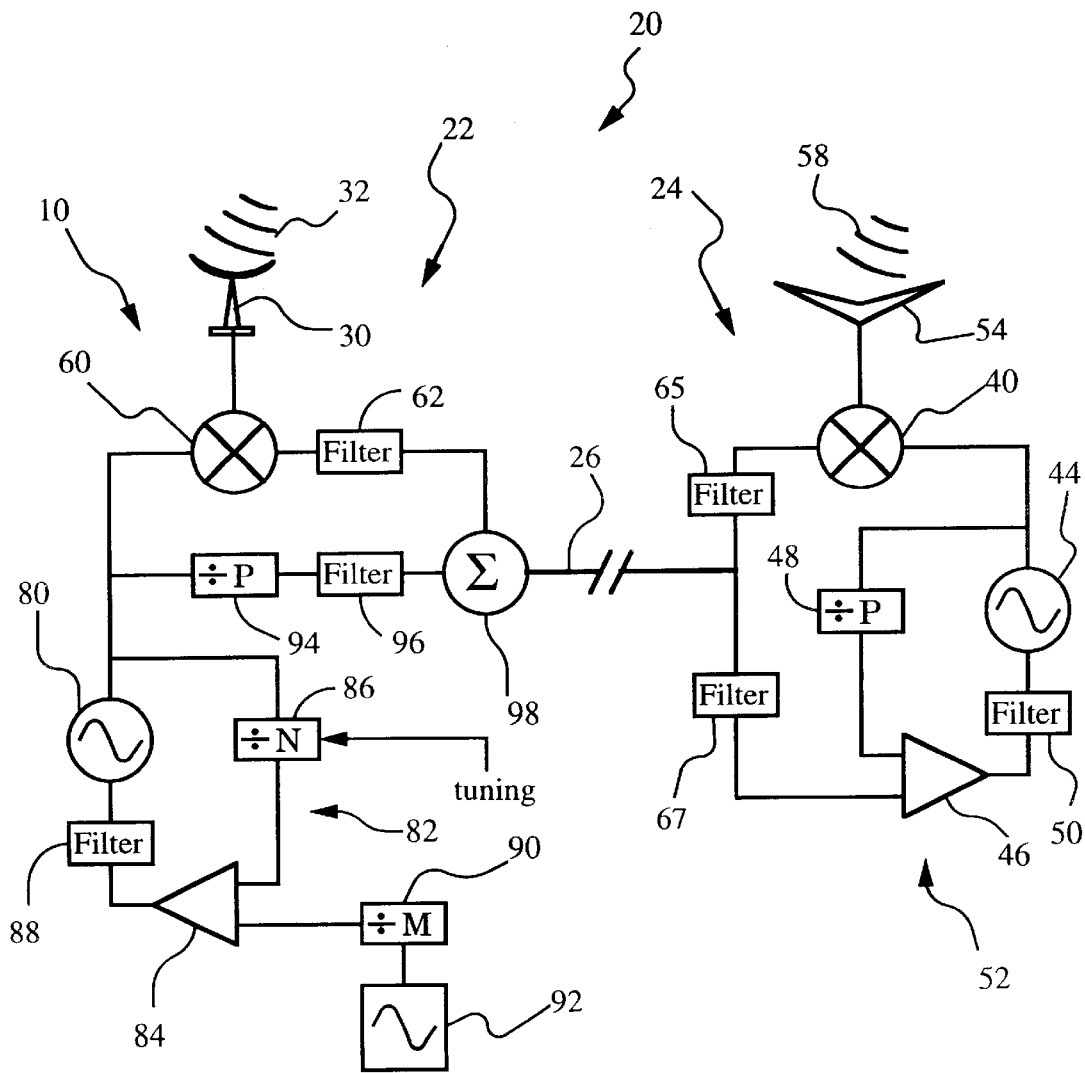
FIG. 2 is a more detailed schematic diagram of a preferred signal distribution system of the present invention.

FIG. 2 is a more detailed schematic diagram of a preferred design for system 20. Central reference means 82 comprises a central reference oscillator (local oscillator) 80. The frequency of the signal emitted by oscillator 80 is proportional to the voltage at the control input of oscillator 80. Oscillator 80 is preferably a voltage-controlled high-frequency oscillator which by itself would emit a signal of low frequency stability. Such oscillators are desirable because of their low cost, minimal requirements on their environment, and wide tuning range, but require stabilization for adequate operation. Oscillator 80 is stabilized by a central frequency stabilization means comprising a phase comparator 84, a tunable frequency divider 86 characterized by a tunable integer N, and a low-pass filter 88.

The central frequency stabilization means and oscillator 80 form a central phase-locked-loop (PLL), which also serves as a frequency multiplication means. The output of oscillator 80 is connected to an input of frequency divider 86. The output of divider 86 is connected to an input of comparator 84. A second input of comparator 84 (also an input for central reference means 82) is connected through filter 88 to an output of a spacing-determining frequency divider 90 characterized by a fixed integer M. The input of divider 90 is connected to an output of a high-stability global reference oscillator 92. Oscillator 92 is preferably a temperature-stabilized crystal oscillator (TCXO) with very low phase noise. Such devices are commercially available, though relatively costly.

A high-stability signal generated using oscillator 92 is delivered to an input of phase-comparator 84 (also the input of central reference means 82). Another input of phase comparator 84 receives a signal from divider 86, generated by frequency-dividing the central reference signal by a tunable integer N. The output of comparator 84 is connected through filter 88 to a control input of oscillator 80. Comparator 84 produces a central adjustment signal representative of the phase difference between the two signals received at its inputs. The central adjustment signal drives oscillator 80. The central reference signal generated by oscillator 80 is thus frequency-stabilized using the high-stability signal generated by oscillator 92.

The output of oscillator 80 is connected to an input of a reference frequency divider 94 characterized by an integer P. The output of divider 94 is connected to a low-pass filter 96 and to transmission means 26. Divider 94 and filter 96 produce a high-stability global tuning signal by frequency-dividing and filtering the central reference signal. Filter 96 is a bandpass or low-pass filter for eliminating undesirable high-frequency components from the signal generated by divider 94. Divider 94 is useful when the central reference signal is of a high-frequency, and thus cannot serve as a global tuning signal to be transmitted through transmission means 26. The number P characterizing divider 94 is chosen such that the global tuning signal is of a frequency suitable for transmission through transmission means 26, and such that the frequency bands of the global tuning signal and the intermediate signal do not overlap. In one implementation, the number P is 256.

Preferably, a summing means 98 adds the signals from the outputs of mixer 60 and divider 94 for transmission through a common transmission line. A filter 65 then selects the intermediate signal for transmission to mixer 40, while a filter 67 selects the global tuning signal for transmission to remote reference means 52.

Remote reference means 52 comprises an oscillator 44, which is preferably a voltage-controlled high-frequency oscillator similar to oscillator 80. Oscillator 44 would produce by itself a low-stability signal. Oscillator 44 is stabilized by a remote frequency stabilization means. The frequency stabilization means comprises a phase comparator 46, a frequency divider 48 characterized by the integer P characterizing divider 94, and a low-pass filter 50. The remote frequency stabilization means and oscillator 44 form a remote phase-locked-loop (PLL). The output of oscillator 44 is connected to an input of frequency divider 48. The output of divider 48 is connected to an input of comparator 46. A second input of comparator 46 is connected to the output of divider 94 over transmission means 26, through filter 96 and filter 67. The output of comparator 46 is connected to a control input of oscillator 44.

The remote reference signal generated by remote reference means 52 is frequency-stabilized using the global tuning signal received through transmission means 26. Phase comparator 46 receives at one input the global tuning signal, and at the other a signal generated by frequency divider 48 by dividing the remote reference signal by the number P. Phase comparator 46 produces a remote adjustment signal reflecting the phase mismatch between the global tuning signal and the remote reference signal. The remote adjustment signal drives oscillator 44. Remote reference means 52 essentially multiplies by P the global tuning signal, generating a signal (the remote reference signal) that is substantially identical to the central reference signal.

High-frequency signal 32 spans a high-frequency band 100, as illustrated in FIG. 3-A. In one implementation, signal 32 spans the AMPS frequency band between 824 and 894 MHz. More generally, signal 32 is within a frequency band commonly used for cellular communications, cordless telephony, personal communication services (PCS), local radio-frequency communications, satellite television, interactive multimedia video, or high-bit rate local area networks (LANs).

FIG. 3-B shows several channels C[j], C[j+1], C[j+2] of signal 32, centered at frequencies $f_j$, $f_{j+1}$, and $f_{j+2}$ respectively. Adjacent channels are separated by an interchannel spacing S, typically on the order of 1 MHz for CDMA signals. The frequencies of channels C[j], C[j+1], C[j+2] are then related by $f_{j+2}=f_{j+1}+S=f_j+2S$.

As illustrated in FIGS. 3-A and 3-C, the intermediate signals generated at different times by system 20 span an IF band 104. FIG. 3-C illustrates a channel C'[k] of the intermediate signal, corresponding to a channel C[k] selected for emission. Channel C'[k] is centered at a frequency $f'_k=f_k-f_{CRS}$. The frequency $f_{CRS}$ is tuned such that channel C'[k] is within a predetermined frequency range defined by filter 62. Only frequencies in that predetermined range are transmitted through transmission means 26.

Let the frequency band allowed by filter 62 be centered at a (fixed) frequency $f_F$. Selecting channel C[k] (centered at a frequency $f_k$) for transmission requires choosing $f_{CRS}$ such that $f_k \pm f_{CRS}=f_F$. If transmission means 26 is a low-bandwidth medium unsuitable for transmitting $f_k+f_{CRS}$, it is preferred that $f_k-f_{CRS}=f_F$. The frequency fCRS is preferably varied in increments of the interchannel spacing S, by varying the number N (characterizing divider 86) between integer values. Varying the number N allows the selection of different channels at different times. The number N satisfies the relation $$N=f_{CRS}/f_{CRM}=M \cdot f_{CRS}/f_{HSO} \quad [1]$$

where $f_{CRM}$ is the frequency of the signal received by central reference means 82, M is the integer characterizing divider 90, and $f_{HSO}$ is the frequency of the signal emitted by high-stability oscillator 92. For a fixed $f_{CRM}$, the number N determines $f_{CRS}$. If the kth channel C[k] of signal 32 is selected for transmission, Eq. [1] can be re-written as $$N=(M/f_{HSO})(f_k-f_F)=(M/f_{HSO})(f_1+(k-1)S-f_F), \quad [2]$$

where $f_1$ is the frequency of the first (lowest-frequency) channel of signal 32. If $f_{HSO}$ and M satisfy the relation $$M/f_{HSO}=1/S, \quad [3]$$

equation [2] becomes $$N=(f_1-f_F)/S+k-1=\text{constant}+k. \quad [4]$$

If the constant $(f_1-f_F)/S$ is chosen to be an integer, filter 62 is tuned to channels of signal 32 for integer values of N. In a typical system in which f1 and S are determined by outside requirements, $f_{HSO}$ and $f_F$ are preferably chosen such that eqs. [3] and [4] are satisfied for integer values of M and N. The (fixed) number M can be thought to determine the frequency step size of central reference means 82 as N is varied between integer values, while the number N determines which channel of signal 32 is transmitted through transmission means 26.

System 20 is advantageous because only one cost-intensive, high-stability oscillator (oscillator 92) is required for accurate up- and down-conversion of signals. The other essential elements of system 20 are simple, easy to install, and generally low-cost. Voltage-controlled oscillators such as oscillators 80 and 44 have low cost, and generate high-stability signals if stabilized using oscillator 92. Phase-locking plural remote subsystems to the same global tuning signal is advantageous since it eliminates the undesirable beating which occurs when the frequencies emitted by different remote subsystems are not exactly identical.

Figure 4:
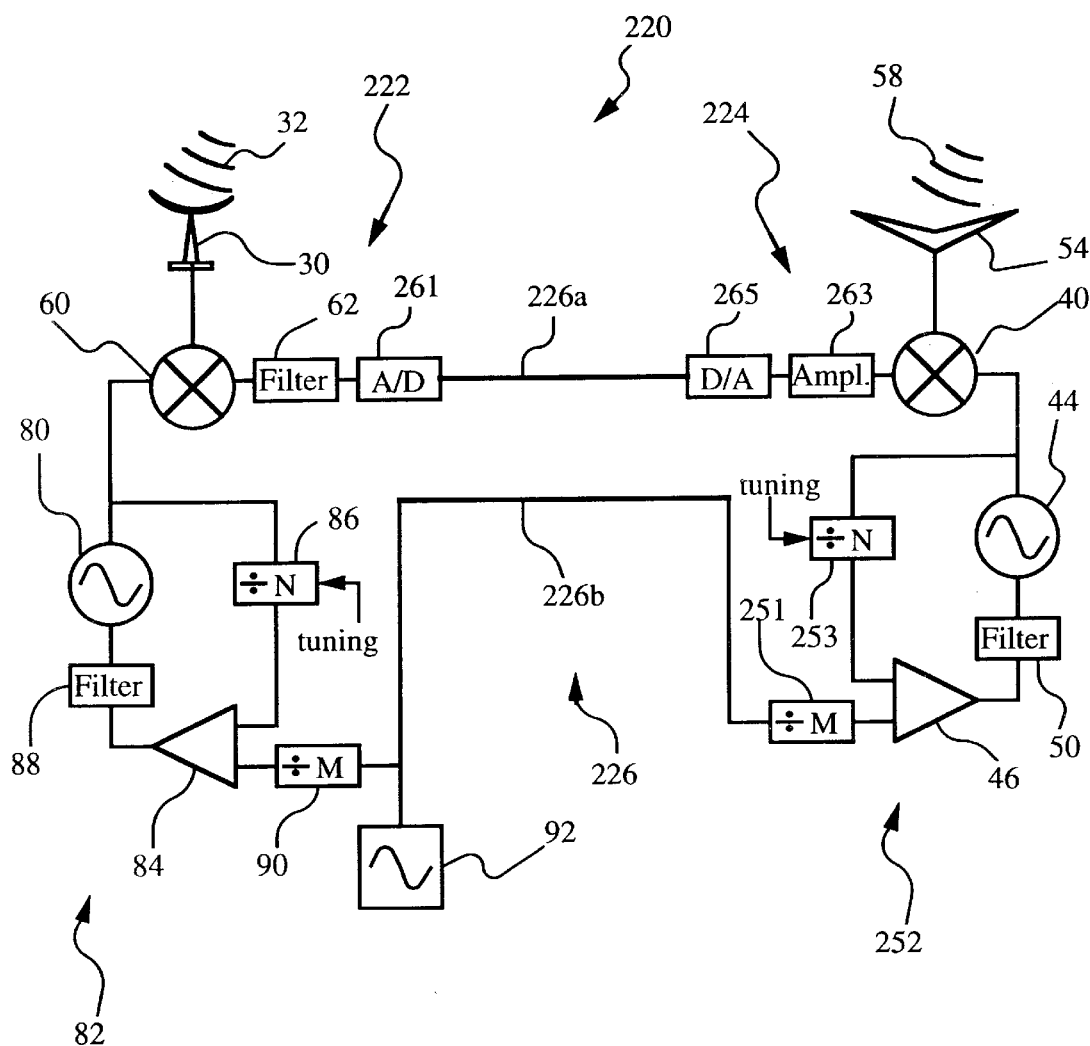
FIG. 4 is a schematic diagram of an alternative signal distribution system of the present invention.

FIG. 4 shows a system 220 according to an alternative embodiment of the present invention. System 220 comprises a central subsystem 222 in communication with a remote subsystem 224 over an intermediate-frequency transmission means 226. Transmission means 226 comprises distinct transmission lines 226a, 226b for transmitting the intermediate signal and the global tuning signal, respectively. An analog-to-digital converter 261 digitizes the intermediate signal after passage through filter 62, and before passage through transmission line 226a. An amplifier 263 amplifies the intermediate signal after passage through transmission line 226a and a digital-to-analog converter 265.

A global tuning signal generated by oscillator 92 is transmitted over transmission means 2266 to an input of a remote reference means 252. Remote reference means 252 comprises a frequency divider 251 between transmission means 226 and phase comparator 46, and a frequency divider 253 between the output of oscillator 44 and the other input of comparator 46. Dividers 251 and 253 are characterized by integer numbers M and N, respectively, such that the remote reference signal generated by remote reference means 252 is substantially identical to the central reference signal generated by central reference means 82. The number N required for tuning remote reference means 252 to a desired emission frequency is transmitted from central subsystem 222 to divider 253, for example as a bit serial data stream. Remote reference means 252 is relatively complex, since the operation it performs is dependent on the channel selected (i.e. is not fixed). In this embodiment, the global tuning signal can be thought to include both the high-stability signal generated by oscillator 92, and the signal encoding the number N transmitted to divider 253.

It will be clear to one skilled in the art that the above embodiments may be altered in many ways without departing from the scope of the invention. For example, various approaches are available in general for the design of the channel selection means. The global tuning means need not be at the same physical location as the central receiving means. Multiple channels may be selected simultaneously by parallelizing the architecture described above. A tunable filter could be used in principle to filter out channels not belonging to the subset {C[k]}; performing channel selection using a tunable filter is relatively impractical, however. Accordingly, the scope of the invention should be determined by the following claims and their legal equivalents.

What is claimed is:

1. A distributed wireless communications system with centralized tunable channel selection, comprising:

a) a central receiving means for receiving a central high-frequency signal comprising a plurality of channels {C[j]}, j=1 ... J;

b) a central tunable channel selection means for tunably selecting a channel C[k] for emission, comprising
a central mixing means in communication with said central receiving means, for generating an intermediate signal from said central high-frequency signal and a central reference signal, said intermediate signal comprising a channel C'[k] corresponding to said channel C[k],
a central reference means in communication with said central mixing means, for controlling a frequency of said central reference signal such that said channel C'[k] is suitable for transmission through a filtering means, and
a global tuning means in communication with said central reference means, for generating a global tuning signal;

c) a plurality of remote mixing means in communication with said central mixing means over said filtering means, for generating a corresponding plurality of remote high-frequency signals, wherein a remote mixing means generates a remote high-frequency signal from said intermediate signal and a remote reference signal, said remote high-frequency signal comprising said channel C[k]; and d) a plurality of remote emission means, wherein a remote emission means is in communication with said remote mixing means and emits said remote high-frequency signal;

wherein said global tuning signal controls a frequency of said remote reference signal, and thereby controls a frequency of said remote high-frequency signal.

2. The system of claim 1 wherein said remote mixing means is in communication with said central mixing means over a transmission means suitable for transmitting said intermediate signal, and unsuitable for transmitting said central high-frequency signal.

3. The system of claim 1 wherein said global tuning signal has a stable frequency relationship with said central reference signal.

4. The system of claim 1 further comprising a remote reference means in communication with said global tuning means, for controlling said frequency of said remote reference signal using said global tuning signal.

5. The system of claim 4 wherein said remote reference means is adapted to generate said remote reference signal by performing a fixed operation on said global tuning signal.

6. The system of claim 4 wherein said remote frequency control means is adapted to frequency-stabilize said remote reference signal using said global tuning signal.

7. The system of claim 4 wherein said remote frequency control means comprises a phase-locked loop for phase-locking said remote reference signal to said global tuning signal.

8. The system of claim 4 wherein said remote reference means comprises a frequency multiplication means for generating said remote reference signal by frequency-multiplying said global tuning signal.

9. The system of claim 8 wherein said frequency multiplication means is adapted to multiply said global tuning signal by a fixed number.

10. The system of claim 8 wherein said frequency multiplication means comprises a phase-locked loop.

11. The system of claim 8 wherein said global tuning means comprises a frequency division means for generating said global tuning signal by frequency-dividing said central reference signal.

12. The system of claim 1 wherein said central channel selection means comprises a high-stability oscillator for generating a central high-stability signal, wherein said global tuning signal has a stable frequency relationship with said central high-stability signal.

13. The system of claim 12 wherein said high-stability oscillator comprises a temperature-stabilized crystal oscillator.

14. The system of claim 1 wherein said central reference means is adapted to generate said central reference signal by frequency-multiplying a high-stability signal by a ratio N/M, wherein
M and N are integers chosen such that an integer change in N corresponds to a change in a frequency of said central reference signal equal to an integer multiple of an interchannel spacing of said set {C[j]}.

15. The system of claim 14 further comprising a remote reference means in communication with said global tuning means, wherein said remote reference means is adapted to generate said remote reference signal by frequency-multiplying said global tuning signal by said ratio N/M.

16. The system of claim 1 wherein said remote signal consists essentially of said channel C[k].

17. The system of claim 1 wherein said remote emission means comprises a repeater antenna for wireless communications.

18. The system of claim 17 wherein said central receiving means comprises a receiver antenna for wireless communications.

19. The system of claim 1 further comprising a digitization means in communication with said filtering means, for digitizing said intermediate signal.

20. The system of claim 1 wherein said channel C[k] comprises a plurality of code-division-multiple-access carriers.

21. The system of claim 1 wherein said central high-frequency signal is within a frequency band selected from a group of bands for cellular communications, cordless telephony, personal communication services, local radio-frequency communications, satellite television, interactive multi-media video, and high bit-rate local area networks.

22. The system of claim 1 wherein said system is adapted for bi-directional communication.

23. The system of claim 1 wherein said central reference signal and said remote reference signal are frequency-matched within an interchannel spacing of said plurality of channels {C[j]}.

24. The system of claim 1 wherein a frequency of said intermediate signal is substantially equal to a frequency difference between said central high-frequency signal and said central reference signal.

25. The system of claim 1 wherein said transmission means comprises a medium selected from a group of 10 base T cable, telephone wire, fiber-optic cable, unshielded cable, and power cable.

26. A distributed wireless communications system with centralized tunable channel selection, comprising:
   a) a central receiver antenna for receiving a central high-frequency signal comprising a plurality of channels $\{C[j]\}$, j=1 . . . J;
   b) a central high-stability oscillator for generating a central high-stability signal;
   c) a central phase-locked loop in communication with said central high-stability oscillator, for generating a central reference signal by frequency-multiplying said high-stability signal by a tunable number;
   d) a central mixing means in communication with said central receiver antenna and said central phase-locked loop, for generating an intermediate signal by mixing said central high-frequency signal and said central reference signal;
   e) a selection filter in communication with said central mixing means, for selecting a channel $C'[k]$ of said intermediate signal for transmission, said channel $C'[k]$ corresponding to a channel $C[k]$ of said central high-frequency signal, an identity of said channel $C'[k]$ being determined by said tunable number;
   f) a frequency divider in communication with said central phase-locked loop, for generating a global tuning signal by frequency-dividing said central reference signal;
   g) a plurality of remote phase-locked loops, wherein a remote phase-locked loop is in communication with said frequency divider, for generating a remote reference signal by frequency-multiplying said global tuning signal;
   h) a plurality of remote mixing means, wherein a remote mixing means is in communication with said selection filter and said remote phase-locked loop, for generating a remote high-frequency signal by mixing said intermediate signal and said remote reference signal, said remote high-frequency signal comprising said channel $C[k]$; and
   i) a plurality of remote repeater antennas, wherein a remote repeater antenna is in communication with said remote mixing means, for emitting said remote high-frequency signal.

27. A distributed wireless communications system with centralized tunable channel selection, comprising:
   a) a central receiving means for receiving a central high-frequency signal comprising a plurality of channels $\{C[j]\}$, j=1 . . . J;
   b) a tunable central channel selection means in communication with said central receiving means, wherein said central channel selection means comprises
      a central mixing means for generating an intermediate signal from said central high-frequency signal and a tunable central reference signal, said intermediate signal defining a channel $C[k]$ selected for emission, and
      a means for generating a global tuning signal;
   c) a plurality of remote reference means in communication with said central channel selection means, a remote reference means generating a remote reference signal by performing a fixed operation on said global tuning signal, said global tuning signal determining a frequency of said remote reference signal;
   d) a plurality of remote mixing means in communication with said central mixing means, a remote mixing means being in communication with said remote reference means, said remote mixing means generating a remote high-frequency signal from said intermediate signal and said remote reference signal, said remote high-frequency signal comprising said channel $C[k]$; and
   e) a plurality of remote emission means, a remote emission means being in communication with said remote mixing means, for emitting said remote high-frequency signal.

* * * * *